United States Patent [19]

Seibel et al.

[11] Patent Number: 4,842,982

[45] Date of Patent: Jun. 27, 1989

[54] RADIATION-SENSITIVE RECORDING MATERIAL HAVING RADIATION-SENSITIVE RECORDING LAYER AND DISCONTINUOUS RADIATION-SENSITIVE COVERING LAYER OF THE SAME COMPOSITION

[75] Inventors: Markus Seibel, Mainz; Guenther Kaempf, Oestrich-Winkel, both of Fed. Rep. of Germany

[73] Assignee: Hoechst Aktiengesellschaft, Frankfurt am Main, Fed. Rep. of Germany

[21] Appl. No.: 62,340

[22] Filed: Jun. 9, 1987

Related U.S. Application Data

[63] Continuation of Ser. No. 772,704, Sep. 5, 1985, abandoned.

[30] Foreign Application Priority Data

Sep. 11, 1984 [DE] Fed. Rep. of Germany ....... 3433247

[51] Int. Cl.$^4$ .................. G03C 1/74; G03C 1/54; G03F 7/16
[52] U.S. Cl. ................... 430/156; 430/162; 430/166; 430/168; 430/271; 430/273; 430/300; 430/302; 430/950
[58] Field of Search ............. 430/156, 162, 166, 950, 430/168, 271, 273, 302, 300

[56] References Cited

U.S. PATENT DOCUMENTS

| | | | |
|---|---|---|---|
| 2,080,965 | 5/1937 | Funck | 95/5.6 |
| 3,353,984 | 11/1967 | Landau | 430/156 |
| 3,484,241 | 12/1969 | Evleth et al. | 430/156 |
| 3,649,283 | 3/1972 | Christensen et al. | 430/166 |
| 3,891,443 | 6/1975 | Halpern et al. | 430/259 |
| 4,075,015 | 2/1978 | Vinkovic et al. | 430/282 |
| 4,168,979 | 9/1979 | Okishi et al. | 96/75 |
| 4,197,128 | 4/1980 | Watanabe et al. | 430/156 |
| 4,288,421 | 9/1981 | Kojima et al. | 430/169 |
| 4,504,566 | 3/1985 | Dueber | 430/156 |
| 4,550,073 | 10/1985 | Neiss et al. | 430/950 |
| 4,557,994 | 12/1985 | Nagano et al. | 430/162 |
| 4,560,636 | 12/1985 | Stahlhofen | 430/950 |

FOREIGN PATENT DOCUMENTS

| | | |
|---|---|---|
| 1148014 | 6/1983 | Canada . |
| 1512080 | 5/1978 | United Kingdom . |
| 1542131 | 3/1979 | United Kingdom . |
| 2081919 | 2/1982 | United Kingdom . |
| 2118862 | 11/1983 | United Kingdom . |

OTHER PUBLICATIONS

Suwa Seikosha, Forming Method of Photo Resist Patterns, May 18, '79, vol. 3 No. 85 (E-124).
Daicel K. K., Exposed Photosensitive Diazo Film for Making Screen Plate, May 27, 1982, vol. 6, No. 168 (P-139).
English Language Abstract of Japanese Patent 58-11943, Published 1/1983.

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

Disclosed is a radiation-sensitive recording material comprising a support, a radiation-sensitive recording layer and a rough covering layer which is applied by spraying and drying a solution which has substantially the same composition as the recording layer. Due to its rough surface, the material provides for accelerated vacuum contact in the copying process. Also disclosed is a process for producing the radiation-sensitive recording material described above.

7 Claims, No Drawings

RADIATION-SENSITIVE RECORDING MATERIAL HAVING RADIATION-SENSITIVE RECORDING LAYER AND DISCONTINUOUS RADIATION-SENSITIVE COVERING LAYER OF THE SAME COMPOSITION

This application is a continuation of application Ser. No. 772,704 filed Sept. 5, 1985 now abandoned.

BACKGROUND OF THE INVENTION

The present invention relates to a radiation-sensitive recording material having a rough surface, which is particularly suitable for use in the preparation of planographic printing plates. The present invention also relates to a process for the production of this material, in which a rough covering layer is produced by spraying and drying a solution which has substantially the same composition as the recording layer.

It is known to provide light-sensitive planographic printing plates with a rough covering layer in order to accelerate evacuation of the copying frame during exposure according to the vacuum contact method. In printing plates having a smooth surface, evacuation of the space between light-sensitive layer and film original may be incomplete, since it is difficult to remove the air from the central portion, especially of large-size plates. The air pockets formed then lead to halation effects in the resulting copy. In these areas, the fine screen dots, in particular, which result are imprecise, incomplete or even in some cases not reproduced. These disadvantages can be obviated to a large extent by using printing plates having light-sensitive layers which have rough surfaces.

Rough surfaces have, for example, been produced by applying a covering layer containing pigment particles (German Offenlegungsschrift No. 2,512,043 corresponding to U.S. Pat. No. 4,168,979). Also, the surface of the light-sensitive layer or of an additional covering layer has been roughened by means of a coating roll having an uneven surface (German Offenlegungsschrift No. 2,533,156 corresponding to British Pat. No. 1,512,080). It is also known to incorporate pigment particles in the light-sensitive layer itself, which are thicker than the layer (German Offenlegungsschrift No. 2,926,236 corresponding to Canadian Pat. No. 1,148,014) or to evenly dust the layer surface with a solids powder which is anchored on the surface by heating (German Offenlegungsschrift No. 3,003,131 corresponding to U.S. Pat. No. 4,288,521).

All processes which use insoluble or sparingly soluble pigments, such as silica, have the disadvantage that these pigments later collect in the developer in the form of a deposit which may congest spray nozzles or cause other trouble.

It is also known to coat the light-sensitive layer with a rough covering layer which is completely soluble in the developer (German Offenlegungsschrift No. 2,606,793 corresponding to British Pat. No. 1,542,131). According to German Offenlegungsschrift No. 3,131,570 (corresponding to British Pat. No. 2,081,919), a covering layer is applied by spray coating from an aqueous solution or dispersion. The covering layer comprises a resin which is soluble either in water alone or at least in the developer solution employed.

A similar process is described in German Offenlegungsschrift No. 3,304,648 (corresponding to British Pat. No. 2,118,862). According to this process, a resin in aqueous solution or dispersion is applied by electrostatic spraying.

The covering layers obtained according to these processes have the disadvantage that they or the particles contained therein, respectively, adhere only relatively loosely to the light-sensitive layer. In fact, when water is used as a solvent or dispersing medium, the light-sensitive layer which is normally insoluble in water is not partly dissolved; therefore, firm anchoring cannot be obtained in the drying process. When a dispersion is used for coating, the dispersed particles are present on the layer surface in their original shape after drying and are not embedded in the layer. When an aqueous solution is used, particles which conform to the layer surface at their places of contact and, therefore, exhibit slightly better adherence, may be formed upon drying of this solution. Nevertheless, in this case also, the particles cannot be embedded in the layer, since the layer surface is not attacked by the spray solution. It is also a disadvantage of water-soluble resins that, during exposure, these resins may react with the photodecomposition products or, during the normally alkaline development, with diazo compounds present in the layer, to form a thin hydrophilic layer on the surface. This thin layer, if removed at all, is not entirely removed during developing. The consequence of this is an insufficient acceptance of ink in the image areas of the printing plate, at least in the beginning of the printing process, which results in a considerable number of waste sheets.

In addition, all covering layers which are soluble in the developer have the disadvantage of prematurely exhausting the developer, as their constituents are completely dissolved in the developing process.

SUMMARY OF THE INVENTION

It is therefore an object of the present invention to provide a radiation-sensitive recording material, especially for use in the preparation of printing plates, in particular planographic printing plates, which exhibits the above-indicated advantages of the known materials with rough surfaces in the copying process.

Another object of the present invention is to provide a recording material of the above type which is more easily manufactured.

A further object of the invention is to provide a recording material of the above type which does not too quickly exhaust the developer.

A still further object of the present invention is to provide a recording material of the type described above that does not more strongly contaminate the developer than a conventional material lacking a rough covering layer.

Yet another object of the present invention is to provide a recording material that has all of the above attributes and a rough covering layer of improved adherence to the surface of the light-sensitive layer, compared with known covering layers of the same type.

Still yet another object of the present invention is to provide a process for the production of a recording material having the advantages described above.

In accomplishing the foregoing objects, there has been provided, in accordance with one aspect of the present invention, a radiation-sensitive recording material, comprising a support, a radiation-sensitive recording layer, and a rough covering layer sprayed on the recording layer, wherein the rough covering layer and the recording layer comprise substantially the same composition. Preferably, the layer weight of the covering layer is in the range from about 0.05 to 1 g/m². It is also preferable that the covering layer substantially comprises a plurality of discrete particles of dried liquid droplets, especially particles having average heights in the range from about 0.1 to 10 μm. It is especially advantageous if the particles have average diameters in the range from about 1 to 400 μm. In a preferred embodiment, the covering layer comprises from about 2 to 1,000 particles per mm².

Additionally, there has been provided in accordance with another aspect of the present invention, a process for the production of a radiation-sensitive recording material having a rough surface, comprising the steps of spraying a solution on a smooth radiation-sensitive recording layer which is present on a support to form a plurality of discrete liquid droplets on the smooth surface, and drying the sprayed solution to form discrete particles from at least a portion of the discrete liquid droplets, wherein the sprayed solution comprises substantially the same constituents as the recording layer. In a preferred embodiment, the solution is electrostatically sprayed onto the smooth recording layer.

In a more preferred embodiment, the process comprises the steps of preparing a support, coating the support with a solution comprising a light-sensitive recording material, drying the coated support, electrostatically spraying the coated support with a solution comprising substantially the same components as the light-sensitive recording solution, wherein the solvent of the sprayed solution partially dissolves the surface of the coated recording material and wherein the sprayed solution forms discrete liquid droplets on the coated support, and drying the sprayed support to form discrete particles from at least a portion of the liquid droplets.

In accordance with yet another aspect of the present invention, there has been provided a radiation-sensitive recording material having a rough surface, prepared by the processes as described above.

In accordance with still yet another aspect of the present invention, there has been provided a planographic printing plate comprising a radiation-sensitive recording material as described above.

Further objects, features and advantages of the present invention will become apparent from the detailed description of preferred embodiments which follows.

DETAILED DESCRIPTION OF THE PREFERRED EMBODIMENTS

The present invention is based on a radiation-sensitive recording material comprising a support, a radiation-sensitive recording layer and a rough covering layer applied by spraying and drying a solution.

The recording material of the present invention is characterized in that the covering layer has substantially the same composition as the recording layer. The covering layer is preferably applied in the form of a solution in an organic solvent.

The present invention also provides a process for the production of a radiation-sensitive recording material having a rough surface, in which a solution is sprayed onto a smooth radiation-sensitive recording layer which is present on a support, in such a manner that discrete liquid droplets are produced on the smooth surface, at least part of which are dried to form discrete particles.

The process of the present invention is characterized in that the sprayed solution contains dissolved constituents which are substantially the same as the constituents of the recording layer.

In the spray coating process of the present invention, the surface of the light-sensitive or radiation-sensitive layer which is to be coated is thoroughly wetted by the droplets of the spray solution, with the solvent or the solvent mixture also dissolving the light-sensitive layer. In this manner, the substance of each droplet is united properly with the locally partly dissolved light-sensitive layer and is firmly anchored to the layer. Since the layer is partly dissolved only in those places in which additional substance is deposited, the original light-sensitive layer is substantially maintained as the base layer. There are no local reductions in layer thickness. During exposure and development, only those layer areas are removed which correspond to the nonimage areas, while the layer together with the sprayed-on layer particles remain in the image areas.

In general, the constituents of the spray solution are dissolved in an organic solvent or a mixture of organic solvents and are applied to the already present light-sensitive layer by spray coating. The concentration of the spray solution and the composition of the solvent must be adjusted so that a sufficient adhesion of the sprayed particles to the underlying light-sensitive layer is ensured and so that the droplets impinging upon the plate flow to a particular extent and thus produce a surface having the desired roughness. In addition to the customary spray process using compressed air, electrostatic spraying has particularly proved useful. Examples of such processes include electrostatic air spraying, electrostatic airless spraying and electrostatic rotational spraying. The apparatuses which are used for carrying out these processes are known. In each of these processes, small liquid droplets are formed, electrostatically charged and then exposed to a strong electric field which has been generated between the electrode from which the liquid droplets emerge and the support carrying the light-sensitive layer on which the rough surface is to be produced. As a rule, the support is grounded to comply with safety regulations. The polarity of the applied voltage depends upon the type of apparatus used and does not have any noticeable influence on the quality of the surface produced. Generally, high voltage in the range from 50 to 120 kV is applied.

In the application of rough covering layers, electrostatic spray coating of the rotational spray-type, optionally assisted by compressed air, has proved particularly useful. The size of the dried particles is in the range between about 0.1 and 10 μm. The particles can have very irregular shapes and may flow together before solidifying to form more extensive structures. By means of this arrangement, rough or uneven covering layers can be produced, the application of which is handled without difficulty and which do not depend on the layer thickness of the underlying light-sensitive layer. Since the applied covering layer comprises the same material as the underlying light-sensitive layer, good adhesion is readily obtainable and differences in surface tension or different coefficients of expansion at temperature changes or the like do not have to be taken into account.

A particular advantage of the present invention over the prior art resides in the fact that the rough covering layer itself is subject to differentiation upon exposure, and thus additionally prevents halation. Moreover, all layer constituents are readily soluble in the developer so that processing difficulties, such as clogging of the developing apparatus with deposits, do not occur.

In the course of experimentation, it has unexpectedly been found that the light-sensitivity of a plate spray-coated with a light-sensitive covering layer, having a layer weight of the sprayed-on layer between about 0.1 and 0.8 g/m$^2$, does not differ from the light-sensitivity of the plate before spray coating with the covering layer. The plate, however, shows all the advantages of plates with rough surfaces.

The layer weight of the sprayed-on covering layer may range between about 0.05 and 1 g/m$^2$, preferred layer weights being from about 0.1 to 0.8 g/m$^2$. The effectiveness of the spray-coated layer is only to a minor degree due to the choice of a particular layer weight, and instead, must be ascribed to the morphology of the surface after drying. The solvent or solvent mixture, and the solids content of the coating solution, must be chosen with care, since which solvent is used depends on the solubility of the layer constituents employed, on the evaporation behavior of the solubilized constituents, and on the desired capability of the liquid droplets impinging on the surface to partly dissolve the layer. A resulting evaporation number of the solvent or solvent mixture in the range between about 10 and 100, preferably between 20 and 70, (diethyl ether=1) has proved to be particularly favorable. Illustrative suitable solvents are methanol, ethanol, butanone, methylisobutyl ketone, tetrahydrofuran, 2-methoxy-ethanol, 2-methoxy-ethyl acetate, 2-ethoxy-ethanol, 2-ethoxy-ethyl acetate, diacetone alcohol, cyclohexanone, methoxy propanol, dimethoxy ethane, pyrrolidone, N-methyl pyrrolidone, γ-butyrolactone, butyl acetate and ethyl acetate.

The solids content of the spray solution usually ranges between about 5% and 50% by weight. After drying, which can be effected by known techniques such as blowing with hot air or irradiation with infrared lamps, the sprayed light-sensitive particles are present on the surface of the light-sensitive layer in random distribution. On an average, the number of particles is in the range from about 2 to 1,000 per mm$^2$. The height of the particles ranges between about 0.1 and 10 $\mu$m, preferably between about 0.1 and 5 $\mu$m. The diameter of the droplets or of the aggregates formed by the droplets flowing together can be from about 1 to 400 $\mu$m.

The recording materials of the present invention are preferably used in the preparation of planographic printing plates; however, the materials are basically suitable for any application involving the exposure of a light-sensitive or radiation-sensitive layer in vacuum contact under an original, in which it is important to obtain a high resolution and an exact reproduction of the image elements. Recording materials produced according to the present invention can, for example, be processed into color proofing films, multi-metal printing plates and screen printing stencils.

As a support for planographic printing plates which are coated with the light-sensitive layers according to the present invention, aluminum which has been mechanically, chemically or electrochemically roughened is generally used. The aluminum can additionally be anodically oxidized in sulfuric or phosphoric acid, as is known in the art, in order that an oxide weight in the range between about 0.5 and 10 g/m$^2$ is obtained.

After roughening and before anodically oxidizing, intermediate pickling in an alkaline or acid medium can additionally be performed on the support. After the anodic oxidation, the support can additionally be subjected to a pretreatment, for example, using silicates or polyvinyl phosphonic acid, in order to improve the properties of the surface, in particular its hydrophilic properties. It is also possible to use other support materials such as steel, copper, chromium, multi-metal plates, plastic or paper, which have optionally been subjected to an appropriate pretreatment.

Suitable light-sensitive layers comprise any positive-working or negative-working layers customary in the reproduction technique. Positive-working layers used particularly include layers based on 1,2-quinone diazides or on acid-cleavable compounds. The latter contain a compound which forms a strong acid under actinic radiation, for example, organic halogen compounds, such as trichloromethyl-substituted s-triazines or other trichloromethyl heterocycles, diazonium salts of strong acids or 1,2-naphthoquinone-2-diazide-4-sulfonyl chloride and a compound which comprises at least one C—O—C group which can be split by acid.

Polyacetals, orthocarboxylic acid esters, enol ethers and N-acylimino carbonates are particularly suitable as compounds which can be split by acid.

Negative-working layers can, for example, comprise layers on a basis of 1,4-quinone diazides, diazonium salt polycondensation products, polymers which are cross-linked under the action of light, such as polyvinyl cinnamate, azides, and photopolymerizable mixtures composed of polymerizable (meth)acrylic esters and photoinitiators.

The light-sensitive layers usually contain water-insoluble polymeric binders. Light-sensitive layers which are to be processed with the preferred aqueous-alkaline developer solutions, should contain binders which are soluble or at least swellable in aqueous alkali. Examples of suitable binders comprise novolaks and copolymers containing carboxyl groups.

The support material is coated with the first light-sensitive layer by spin-coating, dipping, by means of rollers, slot dies, doctor blades or by coater application, as is known in the art. A layer applied in this manner has a layer weight between about 0.2 and 10 g/m$^2$, preferably between 0.5 and 8 g/m$^2$. The layer is completely dried at about 110° to 130° C.

The rough layer is then preferably applied by electrostatic spraying which may be assisted by blowing with compressed air. The electrostatic process has the advantage of a good yield, since, due to the high voltage which is applied between plate (cathode) and spray-head (anode), a strong electric field is generated so that substantially all droplets pass from a spray-disk to the plate.

The solution can readily be adjusted such that the fine droplets formed in the spray process lose part of their solvent content by evaporation, while travelling from the spray nozzle through the electric field to the light-sensitive layer. The droplets thereby adopt a condition, in which they have a higher viscosity and are no longer capable of flowing. Upon impinging on the light-sensitive surface, these droplets form discrete particles, without flowing to any substantial degree, and combine with the underlying light-sensitive layer through the remainder of solvent which is still present. As a result, the particles exhibit an excellent adhesion.

The particle size is readily adjusted by appropriately diluting the starting solution. The number of particles is determined by the amount of solution sprayed. The number of particles per unit of area is a function of the surface area that is moved past the spray nozzle per unit of time.

The dried recording materials are exposed in a vacuum copying frame in contact with a transparent original and then developed, as is customary. The developer solution has the effect of washing away the unexposed layer areas in negative-working layers and the exposed layer areas in positive-working layers. The composition of the developer solution depends on the nature of the light-sensitive layer. Aqueous solutions, particularly aqueous-alkaline solutions, or aqueous solutions of wetting agents are preferred. After development, the spray-coated rough covering layer remains on the light-sensitive layer in the image areas. In application as a planographic printing form, the image areas having a rough surface usually exhibit a particularly good ink receptivity. As for the remaining processing, the recording material of the present invention is processed in exactly the same manner as a conventional material which has an identical composition, but does not carry a rough covering layer.

The process of the present invention has, above all, the following advantages:

1. A special process step for preparing the particles, for example, grinding, classifying, dispersing, is not required. Modifications are effected rapidly and without difficulty.

2. As the same layer composition is used in the sprayed layer and in the actual light-sensitive layer, problems which are caused by the covering layer and the underlying light-sensitive layer having different solubilities in the developer do not occur.

3. The sprayed light-sensitive particles have an excellent adhesion to the underlying light-sensitive layer.

4. Halation is prevented.

5. The evacuation time in the exposure frame is markedly reduced.

6. The exposure time is not extended by the sprayed layer.

7. The developer is not contaminated by insoluble foreign substances and is not exhausted more rapidly than in the case of a plate without a sprayed covering layer.

In the following examples, preferred embodiments of the present invention are described. Parts by weight (p.b.w.) and parts by volume (p.b.v.) are related as g/cm$^3$. Percentages and quantitative proportions are to be understood as relating to units by weight, unless otherwise indicated.

EXAMPLE 1

A slot die was used for coating an electrolytically roughened and anodically oxidized aluminum web with the following solution:

6.6 p.b.w. of a cresol-formaldehyde novolak having a softening range from 105° to 120° C. according to DIN 53 181, 1.1 p.b.w of the 4-(2-phenyl-prop-2-yl)-phenyl ester of 1,2-naphthoquinone-2-diazide-4-sulfonic acid, 0.6 p.b.w. of 2,2'-bis-(1,2-naphthoquinone-2-diazide-5-sulfonyloxy)-dinaphthyl-(1,1')-methane, 0.24 p.b.w. of 1,2-naphthoquinone-2-diazide-4-sulfonyl chloride, and 0.08 p.b.w. of crystal violet in 91.38 p.b.w. of a solvent mixture composed of 4 p.b.v. of 2-methoxy-ethanol, 5 p.b.v. of tetrahydrofuran and 1 p.b.v. of butyl acetate.

The coated web was dried in a drying channel at temperatures up to 120° C.

The web was then cut to sizes, part of which (plate A) was retained, while the remainder was passed through an electrostatic coating apparatus. The coating electrode comprised a centrifugal atomizer (rotary cup atomizer), which was driven pneumatically, by means of compressed air. The number of revolutions obtainable was between 30,000 and 50,000 r.p.m and was a function of the pressure used. In the apparatus employed, the pressure measured 5 bars. The high voltage applied was 80 kV, the negative pole being connected to the coating electrode and the plate to be coated together with the means for transporting the plate being grounded. The pump used had a pumping capacity of 1.8 cm$^3$ and a pump speed of 20 r.p.m. The distance between the rotary cup and the plate surface was 260 mm, the transport speed was 2.5 m/min.

The coating solution used contained the same solid constituents in the same quantities as the aboveindicated solution; however, in this case, the solid constituents were dissolved in 51.72 p.b.w. of a solvent mixture composed of 7 p.b.v. of cyclohexanone, 2 p.b.v. of 2-ethoxy-ethanol and 1 p.b.v. of butyl acetate.

After spray-coating, the plate was post-dried for three minutes in a circulating air oven at 100° C. The result was a rough surface comprising light-sensitive particles which adhered excellently to the substrate (Plate B).

This plate was compared with the corresponding plate (Plate A) without additional coating. The layer weight was 2.34 g/m$^2$ in Plate A and 2.79 g/m$^2$ in Plate B.

While Plate B could be brought into complete contact with the copying original in the copying frame after an evacuation time (without rough vacuum) of only 20 seconds, without halation phenomena occurring after exposure, the corresponding comparative plate (Plate A), which did not have a rough surface, could only be placed in intimate contact with the film original after an evacuation period of 60 seconds for the rough vacuum and another 60 seconds for the final vacuum.

When large-size printing plates, for example, of 1270×1035 mm, were used, which were mounted in the copying frame together with a transparent copying original of the same size having a 50% screen area (60 lines/cm screen) and the copies produced in the process were compared after an identical evacuation period of, for example, 20 seconds for 0 to 85% vacuum, the following results were obtained.

In Plate B, the screen areas of the copying original had been perfectly transferred during the below-indicated exposure time, whereas halation phenomena appeared in Plate A, in the form of local visually lighter spots in the screen area, due to screen dots which had become more acute (smaller); occasionally, screen dots had even disappeared completely. The exposure time, at which the 15 μm area of a commercial resolution test original (Fogra PMS-K) was no longer reproduced after imagewise exposure and development in the developer as specified below, was 100 seconds for both Plates A and B. This was unexpected insofar as Plate B had a higher total layer weight.

The printing plates produced in this manner were developed with a developer having the following composition:

5.3 p.b.w. of sodium metasilicate×9H$_2$O, 3.4 p.b.w. of trisodium phosphate×12H$_2$O, 0.3 p.b.w. of sodium dihydrogen phosphate (anhydrous), 91.0 p.b.w. of water.

EXAMPLE 2

An aluminum web which had been roughened by brushing with steel wire brushes was coated with a solution composed of 1.50 p.b.w. of the ester of 1 mole of 2,4-dihydroxy-3,5-dibromobenzophenone and 2 moles of 1,2-naphthoquinone-2-diazide-5-sulfonic acid,
5.20 p.b.w. of a phenol-formaldehyde novolak containing 14% of phenolic OH groups and having a softening point in the range from 110° to 120° C. according to DIN 53 181,
0.20 p.b.w. of polyvinyl butyral
0.17 p.b.w. of crystal violet,
0.08 p.b.w. of Sudan Yellow GGN (C.I. 11,021) and
0.60 p.b.w. of tris-($\beta$-chloroethyl)-phosphate in
92.25 p.b.w. of a solvent mixture composed of 40 p.b.v. of 2-methoxy-ethanol and 50 p.b.v. of tetrahydrofuran and was then dried in a drying channel at temperatures up to 110° C.

The coated web was thereafter cut to sizes and passed through the electrostatic coating apparatus specified in Example 1. The spray solution contained the same quantities of the same non-volatile constituents as the above-indicated coating solution, but in this case, the non-volatile constituents were dissolved in 92.27 p.b.w. of a solvent mixture composed of 80 p.b.v. of 2-methoxy-ethanol, 10 p.b.v. of cyclohexanone and 10 p.b.v. of ethyl acetate. A rough surface was obtained, which comprised light-sensitive particles having an excellent adherence to the substrate. The time required for attaining the vacuum was markedly reduced.

EXAMPLE 3

A solution composed of 25 p.b.w. of the bis-(5-ethyl-5-butyl-1,3-dioxan-2-yl)-ether of 2-ethyl-2-butyl-1,3-propanediol,
71 p.b.w. of the cresol-formaldehyde novolak as in Example 1,
3.3 p.b.w. of 2-(acenaphth-5-yl)-4,6-bis-trichloromethyl-s-triazine,
0.7 p.b.w. of crystal violet base, and
900 p.b.w. of 2-methoxy-ethanol was coated onto an electrolytically roughened and anodically oxidized aluminum foil and dried.

The coated web was then cut to sizes and passed through the electrostatic coating apparatus as specified in Example 1.

The coating solution contained the same quantities of the same layer constituents as above; however, the constituents were dissolved in 1018 p.b.w. of a solvent mixture composed of 7 p.b.v. of 2-ethoxy-ethyl acetate, 2 p.b.v. of 1,2-dimethoxy-ethane and 1 p.b.v. of $\gamma$-butyrolactone The result was a rough surface comprising light-sensitive particles which adhered excellently to the substrate. The printing form so prepared could be used for producing very large print runs.

Similar results were obtained when the same quantities of the 2,4-bis-diphenoxymethoxy-acetophenone or of the polyacetal of 1-ethyl-propionaldehyde and triethylene glycol were substituted for the indicated orthoester derivative.

EXAMPLE 4

An electrolytically roughened and anodically oxidized aluminum plate was immersed for 1 minute in a solution of 0.3 percent by weight of polyvinyl phosphonic acid in water at a temperature of 60° C. and then rinsed, dried, coated with the following solution and again dried:

0.7 p.b.w. of the polycondensation product of 1 mole of 3-methoxy-diphenylamine-4-diazonium sulfate and 1 mole of 4,4'-bis-methoxymethyl-diphenylether, precipitated as the mesitylene sulfonate,
3.4 p.b.w. of an 85% strength phosphoric acid,
3.0 p.b.w. of a modified epoxy resin, obtained by reacting 50 g of an epoxy resin having a molecular weight below 1,000 and 12.8 g of benzoic acid in 2-methoxy-ethanol, in the presence of benzyltrimethyl ammonium hydroxide,
0.44 p.b.w. of finely ground Heliogen Blue G (C.I. 74,100),
62.0 p.b.w. of 2-methoxy-ethanol,
30.6 p.b.w. of tetrahydrofuran and
8.0 p.b.w. of 2-methoxy-ethyl acetate.

The coated web was then cut to sizes (Plate C) and passed through the electrostatic coating apparatus specified in Example 1.

The coating solution used had the same constituents as above; however, the constituents were dissolved in 86.5 p.b.w. of a solvent mixture composed of 64 p.b.v. of 2-ethoxy-ethanol, 3 p.b.v. of methanol and 1 p.b.v. of butyl acetate. The plate was then post-dried for 3 minutes at 100° C. The resulting rough surface comprised light-sensitive particles which adhered excellently to the substrate (Plate D). Plate D, exhibiting a rough surface according to the present invention, was compared with the corresponding plate without a rough surface (Plate C). Plate C had a layer weight of 0.98 g/m$^2$, the layer weight of Plate D was 1.12 g/m$^2$.

While the printing plate produced according to the present invention (Plate D) could be brought into complete contact with the copying original in the copying frame after an evacuation period (without rough vacuum) of only 20 seconds, without giving rise to halation phenomena after exposure, an evacuation period of 50 seconds for the rough vacuum and another 40 seconds for the final vacuum was required to place the corresponding comparative printing plate (Plate C) in intimate contact with the film original.

When large-size printing plates, for example, of 1270×1035 mm, were mounted in the copying frame with a transparent copying original of the same size, having a 50% screen area (60 lines/cm screen) and the copies produced in the process were compared after an evacuation period of 20 seconds for 0 to 85% vacuum, the following results were obtained.

While the screen areas of the copying original had been perfectly transferred in Plate D during the below indicated exposure time, halation phenomena appeared in Plate C, in the form of certain irregularities in the screen area of the imagewise exposed and developed plate, due to screen dots which had increased in size.

The exposure time at which step 5 of a stepwedge comprising 13 steps with density increments of 0.15 appeared as a solid step after imagewise exposure and development with the developer as specified below, was 30 seconds for both Plate C and Plate D. This was unexpected insofar as Plate D had a higher layer weight.

The two plates were developed with a solution composed of
2.8 p.b.w. of $Na_2SO_4 \times 10H_2O$,
2.8 p.b.w. of $MgSO_4 \times 7H_2O$,
0.9 p.b.w. of orthophosphoric acid (85% strength),
0.08 p.b.w. of phosphorous acid and
1.6 p.b.w. of a non-ionic wetting agent in
10.0 p.b.w. of benzyl alcohol
20.0 p.b.w. of n-propanol and
60.0 p.b.w. of water.

EXAMPLE 5

A solution composed of
10 p.b.w. of the diazonium salt condensation product indicated in Example 4,
4 p.b.w. of the azo dye obtained from 2,4-dinitro-6-chlorobenzene diazonium salt and 2-methoxy-5-acetylamino-N-hydroxyethyl-N-cyanoethyl-aniline,
1 p.b.w. of Metanil Yellow (C.I. 13,065) and
2 p.b.w. of phosphoric acid (85% strength) and
970 p.b.w. of 2-methoxy-ethanol
was coated onto an electrolytically roughened and anodically oxidized aluminum foil having a thickness of 0.15 mm.

The coated web was then cut to sizes and passed through the electrostatic coating apparatus specified in Example 1.

The coating solution used contained the same constituents as the first coating solution; however, in this case, the constituents were dissolved in 42 p.b.w. of a solvent mixture composed of 6 p.b.v. of 2-ethoxy-ethanol, 3 p.b.v. of methanol and 1 p.b.v. of butyl acetate.

Coating was followed by drying for 3 minutes at 100° C. The resulting rough surface comprised light-sensitive particles which adhered excellently to the substrate.

EXAMPLE 6

An aluminum support which had been roughened by brushing with an aqueous abrasive suspension and then treated with an aqueous solution of polyvinyl phosphonic acid was coated with the following solution:
0.6 p.b.w. of the diazonium salt condensation product indicated in Example 4,
0.06 p.b.w. of phosphoric acid (85% strength),
1.7 p.b.w. of polyvinyl formal (molecular weight 30,000, 7% of hydroxyl groups) and
2.7 p.b.w. of a dispersion containing 10% of copper phthalocyanine pigment (C.I. 74,160) and 10% of polyvinyl formal in 2-methoxy-ethyl acetate in
95 p.b.w. of 2-methoxy-ethanol The coated web was then cut to sizes and passed through the electrostatic coating apparatus specified in Example 1. In the process, a coating solution was used, which comprised the same constituents as indicated above, but which were dissolved in 49.2 p.b.w. of a solvent mixture composed of 8 p.b.v. of 2-ethoxy-ethanol and 2 p.b.v. of methanol. Coating was followed by drying for 3 minutes at 100° C.

Development was carried out using the following solution:
5.7 p.b.w. of $MgSO_4 \times 7H_2O$,
25.5 p.b.w. of n-propanol,
1.1 p.b.w. of 2-(n-butoxy)-ethanol,
0.7 p.b.w. of alkyl-polyethoxy-ethanol,
67.0 p.b.w. of water.

A rough surface was obtained which comprised light-sensitive particles adhering excellently to the substrate.

The printing form so prepared could be used for producing a very large print run.

EXAMPLE 7

An electrochemically roughened and anodically oxidized aluminum which had an oxide layer of 2 g/m² and had been pretreated with an aqueous solution of polyvinyl phosphonic acid, was used as a support for printing plates.

A solution composed of
2 p.b.w. of a styrene-maleic anhydride copolymer which was partly esterified with an alkanol and had an average molecular weight of 20,000 and an acid number of about 200,
2 p.b.w. of a 50% strength solution of a diurethane, obtained by reacting 1 mole of hexamethylene diisocyanate with 2 moles of glycerol dimethacrylate, in butanone,
0.125 p.b.w. of 9-phenyl-acridine and
0.05 p.b.w. of the blue dye indicated in Example 5 in
25 p.b.w. of butanone and
12 p.b.w. of butyl acetate,
was coated onto the above-described support, by means of a doctor blade. The plate was then dried for 2 minutes in a circulating air oven at 100° C. The layer weight obtained was in the range from about 3.7 to 4 g/m².

The coated plate was then passed through the electrostatic coating apparatus specified in Example 1. The solution used for coating contained the same constituents as above, which were dissolved in 63 p.b.w. of a solvent mixture composed of 4 p.b.v. of 2-ethoxy-ethanol, 3 p.b.v. of 2-ethoxy-ethylacetate, 2 p.b.v. of butanone and 1 p.b.v. of butyl acetate. This plate was dried for 3 minutes at 90° C. A rough surface was obtained, which comprised light-sensitive particles adhering excellently to the substrate.

The following solution was used for developing:
3.0 p.b.w. of sodium metasilicate x $9H_2O$,
0.03 p.b.w. of a non-ionic wetting agent (coconut fatty alcohol polyoxyethylene ether having about 8 oxyethylene units),
0.003 p.b.w. of an anti-foaming agent,
0.02 p.b.w. of nitrilotriacetic acid and
0.53 p.b.w. of strontinum chloride x $6H_2O$, in
96.894 p.b.w. of demineralized water.

The printing plate so prepared could be used for producing a very large print run.

EXAMPLE 8

An electrochemically roughened and anodically oxidized, 0.3 mm thick aluminum was used as the support. The support had an oxide layer of 2 g/m² and had been pretreated with an aqueous solution of polyvinyl phosphonic acid.

A solution having the same composition as the first-mentioned solution in Example 7 was coated onto the above-described support by means of a doctor blade. Thereafter, the plate was dried for 2 minutes in a circulating air oven at 100° C. The layer weight obtained was in the range from about 3.7 to 4 g/m².

An air spray apparatus was then used to spray the same coating solution onto the pre-coated printing plate, at a pressure of 2 bars and a distance of 30 cm between spray apparatus and plate. As a result, a rough surface was obtained, which closely resembled the rough surface of Example 7.

The plate was processed using the developer specified in Example 7.

What is claimed is:

1. A radiation-sensitive recording material, consisting essentially of a support, a radiation-sensitive recording layer and a radiation-sensitive, rough, discontinuous covering layer which is distinct from said radiation-sensitive recording layer, said covering layer being sprayed on said recording layer in the form of a solution which contains an organic solvent, said solvent partially dissolving the surface of said recording layer, wherein (A) said rough covering layer and said recording layer comprise substantially the same composition, said composition being an admixture suited for the preparation of a planographic printing plate that presents a roughened outer surface; and (B) said rough covering layer comprises a plurality of discrete particles formed by drying at least a portion of the liquid droplets of said solution.

2. A recording material as claimed in claim 1, wherein the layer weight of said rough covering layer is in the range from about 0.05 to 1 g/m$^2$.

3. A recording material as claimed in claim 1, wherein said discrete particles have average heights in the range from about 0.1 to 10 μm.

4. A recording material as claimed in claim 1, wherein the particles have average diameters in the range from about 1 to 400 μm.

5. A recording material as claimed in claim 1, wherein said covering layer comprises from about 2 to b 1,000 particles per mm$^2$.

6. A planographic printing plate comprising a radiation-sensitive recording material as claimed in claim 1.

7. A recording material as claimed in claim 1, wherein said recording layer has a layer weight in the range from about 0.2 to 10 g/m$^2$.

* * * * *